(12) United States Patent
Zhuang

(10) Patent No.: US 11,309,508 B2
(45) Date of Patent: Apr. 19, 2022

(54) MULTI-FUNCTIONAL OPTICAL COMPOSITE BOARD HAVING QUANTUM DOTS OF HIGH UNIFORMITY

(71) Applicant: HUIZHOU KDZ PHOTOELECTRIC TECHNOLOGY CO., LTD., Huizhou (CN)

(72) Inventor: Xingchao Zhuang, Huizhou (CN)

(73) Assignee: HUIZHOU KDZ PHOTOELECTRIC TECHNOLOGY CO., LTD., Huizhou (CN)

( * ) Notice: Subject to any disclaimer, the term of this patent is extended or adjusted under 35 U.S.C. 154(b) by 6 days.

(21) Appl. No.: 16/953,909

(22) Filed: Nov. 20, 2020

(65) Prior Publication Data

US 2021/0159436 A1 May 27, 2021

(30) Foreign Application Priority Data

Nov. 21, 2019 (CN) .......................... 201911149517.6

(51) Int. Cl.
*H01L 51/50* (2006.01)
*H01L 51/00* (2006.01)

(52) U.S. Cl.
CPC ........ *H01L 51/502* (2013.01); *H01L 51/0096* (2013.01)

(58) Field of Classification Search
CPC .......................... H01L 51/502; H01L 51/0096
See application file for complete search history.

(56) References Cited

U.S. PATENT DOCUMENTS

2019/0360662 A1* 11/2019 Liu .................. H05B 33/14

* cited by examiner

*Primary Examiner* — Anthony Ho
(74) *Attorney, Agent, or Firm* — Nath, Goldberg & Meyer; Jerald L. Meyer

(57) ABSTRACT

A multi-functional optical composite board having quantum dots of high uniformity is provided herein, the multi-functional optical composite board comprises a diffusion base layer, a first quantum dot-containing layer disposed on the lower surface of the diffusion base layer, and a second quantum dot-containing layer disposed on the upper surface of the diffusion base layer, wherein the first quantum dot-containing layer comprises a red quantum dot-containing layer and a green quantum dot-containing layer, and the second quantum dot-containing layer is sequentially deposited on the upper surface of the diffusion base layer by coating repeatedly. The present invention improves the optical composite board from the structure, raw material and compositions thereof, and obtains a multi-functional optical composite board having a high light diffusion, a high uniformity of emitting-light, and the emitting-light of the resultant product appears much whiter and brighter.

11 Claims, 2 Drawing Sheets

MULTI-FUNCTIONAL OPTICAL COMPOSITE BOARD HAVING QUANTUM DOTS OF HIGH UNIFORMITY

CROSS-REFERENCE TO RELATED APPLICATIONS

The present application claims priority of Chinese patent application No. CN201911149517.6, entitled "a multi-functional optical composite board having quantum dots of high uniformity".

TECHNICAL FIELD

The present invention relates to the field of photoelectric materials, specifically to a multi-functional optical composite board having quantum dots of high uniformity, which is used in backlight display devices.

BACKGROUND

It is known that when the light rays encounter two mediums having different refractive index from each other in the travelling path, refraction, reflection and scattering occur. Diffusion plates utilize chemical or physical means, in particular, by adding inorganic or organic light diffusing agents into the substrate such as PMMA, PC, PS, PP and the like, or by arranging the array of the micro characteristic structures on the surface of the substrate, so as to allow the light rays refracted, reflected and scattered in different directions, and thereby to change travelling paths of the light rays, and to achieve the technical effects of optical diffusion resulting from sufficiently scattering incident light. Now, diffusion plates are widely applied in liquid crystal display, LED illumination and imaging display systems. The main functions of diffusion plates lie in sufficiently scattering incident light to obtain a softer and more uniform irradiation effect.

The quantum dot is a nanometer crystal, and is composed of semiconductor material. Compared with the materials of fluorescent particles, the nano-materials of quantum dots have many advantages. For example, quantum dots can generate more dense light at a narrow wavelength band, and have a high stability, a good fluorescent emitting property in visible light band, a continuous excitation spectrum, a tunable fluorescence peak position corresponding to specific physical sizes. However, in prior art there present some deficiencies in backlight source solutions adopting blue light sources and quantum dot technology. The deficiencies need to be overcome by common diffusion plates matching with quantum dot films. The processes of producing quantum dot films are generally complex, high demanding, and with a low productivity. It also has a difficult post-processing procedure and an expensive total costs. In particular, in current backlight solutions, red quantum dots and green quantum dots are excited by blue light, and mixed with blue light to form white light. However, in the backlight module, the reflection sheet has a low reflectivity rate to blue light which has a short wavelength, and it results to the facts that such backlight sources has a lower brightness by 40%-50% than the backlight sources of common white light emitting diodes which have a same optical film structure and a same power consumption. The display brightness of the liquid crystal display device using such backlight sources is also reduced by more than 20%. This leads to a result that relatively much higher power consumption will be required for prior backlight source solutions in prior quantum dot technology if the same display brightness is to be achieved.

SUMMARY

The purpose of the present invention is to provide a multi-functional optical composite board having quantum dots of high uniformity. The present invention improves an optical composite board from the aspects of structure, raw material and composition, and obtains a multi-functional optical composite board from common diffusion plate, the multi-functional optical composite board having a high light diffusion and a high uniformity of emitting-light. The emitting-light of the resultant product is much whiter and brighter. There is no need to adopt quantum dot films in the multi-functional optical board and thus not only reduce processing procedures and improve productivity, but also significantly reduce production costs.

In order to solve the above deficiencies in the prior art, the present application provides the technical solutions which are set forth in the below.

A multi-functional optical composite board having quantum dots of high uniformity, comprising a diffusion base layer, a first quantum dot-containing layer disposed on the lower surface of the diffusion base layer, and a second quantum dot-containing layer disposed on the upper surface of the diffusion base layer, wherein:

the diffusion base layer comprises Generral Polystyrene (GPPS) basal body, and functional additive particles uniformly distributed and blended in the GPPS basal body;

the first quantum dot-containing layer comprises a red quantum dot-containing layer and a green quantum dot-containing layer, wherein the red quantum dot-containing layer comprises a first viscose substrate, and red quantum dot particles uniformly distributed and blended in the first viscose substrate; the green quantum dot-containing layer comprises a second viscose substrate, and green quantum dot particles uniformly distributed and blended in the second viscose substrate; the red quantum dot-containing layer is uniformly coated on the lower surface of the diffusion layer by a coating process; the green quantum dot-containing layer is uniformly coated on the lower surface of the red quantum dot-containing layer by a coating process;

the second quantum dot-containing layer comprises a third viscose substrate and a plurality of different quantum-dot particles uniformly distributed and blended in the third viscose substrate, the plurality of different quantum-dot particles may be a mixture consisting of red quantum dot particles and green quantum dot particles, the second quantum dot-containing layer is deposited on the upper surface of the diffusion base layer by coating repeatedly.

In further, the GPPS basal body consists of GPPS as a main material, and the functional additive particles are a mixture of two or three or more compositions selected from a light diffusing agent, a grinding agent, a dispersant, an antioxidant, a lubricant, a filling agent, a heat-resistant additive and/or a rigid additive; wherein the GPPS main material in the diffusion layer has a mass percentage of from 75% to 85%, and the additive particles has a mass percentage of from 15 to 25%.

In further, the diffusion base layer is prepared by an extrusion molding process, the extrusion molding process comprises: blending the GPPS basal body and the functional additive particles in accordance with a preset mass percentages thereof, to obtain an uniform mixture feed; and extrusion molding the uniform mixture feed.

In further, the red quantum dot particles are fluorescent nanoparticles made of a semiconductor material, the red quantum dot particles have an average size of from 2 to 6 nm, and the red quantum dot particles are selected from CdSe, $CuInS_2$, $CuInSe_2$ or any combinations thereof.

In further, the green quantum dot particles are fluorescent nanoparticles made of a semiconductor material, the green quantum dot particles have an average size of from 2 to 6 nm, and the green quantum dot particles are selected from CdSe, $CuInS_2$, $CuInSe_2$ or any combinations thereof.

In further, the red quantum dot particles and the green quantum dot particles are in a regular shape selected from spherical shape, dish and the like.

In further, the first viscose substrate is a mixture of one or several selected from ingredient 1 of a first glue, ingredient of a second glue, varnish and n-Butyl acetate at a mass ratio of 44.5:2.94:50:15.2. The first viscose substrate is prepared, for example, by the following steps: blending ingredient 1 of the first glue, ingredient of the second glue, varnish and n-butyl acetate at a mass ratio of 44.5:2.94:50:15.2; and coagulating and shaping the first viscose substrate by a heating cure or UV light cure. The second viscose substrate is a mixture of one or several selected from ingredient 2 of a first glue, ingredient of a second glue, varnish and n-butyl acetate at a mass ratio of 46.2:5.35:50:15.2. The second viscose substrate is prepared, for example, by the following steps: mixing ingredient 1 of the first glue, ingredient of the second glue, varnish and n-butyl acetate at a mass ratio of 46.2:5.35:50:15.2; and coagulating and shaping the second viscose substrate by a heating cure or UV light cure. The third viscose substrate is a mixture of one or several selected from ingredient 1 of a first glue, ingredient 2 of a first glue, ingredient of a second glue, varnish and n-butyl acetate at a mass ratio of 44.5:46.2:8.29:100:30.4, and The third viscose substrate is prepared by, for example, the following steps: mixing ingredient 1 of the first glue, ingredient 2 of the first glue, ingredient of the second glue, varnish and n-butyl acetate at a mass ratio of 44.5:46.2:8.29:100:30.4; and coagulating and shaping the third viscose substrate by a heating cure or UV light cure.

Preferably, the first glue and the second glue are selected from conventional curing agents for light-transparent materials. In particular, the first glue and/or the second glue include curable adhesives. The ingredient 1 of the first glue is selected from any of quantum dot-containing UV glues which is referred to as UV curable adhesives, and the ingredient 2 of the first glue is another UV curable adhesive without any quantum dots.

In further, the diffusion base layer has a thickness of from 0.5 to 1.5 mm, the first quantum dot-containing layer has a thickness of from 0.3 to 0.5 mm, and the second quantum dot-containing layer has a thickness of from 0.1 to 0.3 mm.

In comparison to prior art in this field, the present invention achieves the following advantages and technical effects.

(1) According to one embodiment of this application, a first quantum dot-containing layer in which red quantum dot particles and green quantum dot particles are blended is coated on the lower surface of the diffusion layer, and, a second quantum dot-containing layer in which red quantum dot particles and green quantum dot particles are blended is coated on the upper surface of the diffusion layer. Since both of the quantum-dot containing layers include quantum dot particles, which may absorb and transform blue incident right, the quantum dot-containing layers are able to reflect off more incident visible light within the wavelength band of 360-475 nm. Therefore, it enable the optical composite board products appear much whiter and brighter. Meanwhile, it is realized that the light rays emitted from the light emitting surface is white and has a reduced color difference. It effectively solves the technical problem of color differences in the visible area of the product, and the backlight module has a high uniformity in the color gamut.

(2) In the present invention, in further, GPPS are used as main materials of the GPPS basal body. By uniformly blending the GPPS basal body and functional additive particles such as a light diffusing agent, a dispersant, an antioxidant, and the like, it produces a multi-functional optical composite board which improves greatly in structure, raw material and composition, and allows the multi-functional optical composite board to have a high light diffusivity, a high uniformity of emitting-light, and allows the emitting-light of the resultant product to appear much whiter and brighter.

(3) In accordance with the present invention, each of the compositions are uniformly distributed and blended in the resultant multi-functional composite board, and thus when the incident blue right runs through the multi-functional board, the incident blue right shall encounter all the particles and refraction, reflection, scattering and transformation occurs, then the light rays can evenly penetrate the multi-functional composite board, not exposing the light sources, so as to achieve a change from point light source to area light source.

BRIEF DESCRIPTION OF THE DRAWINGS

The present invention shall be better understood by referring to the following description given below in combination with the accompanying drawings, in which the same or similar components are represented by the same or similar signs throughout the drawings. The drawings, along with the following detailed description, are included in the specification, constitute part of the specification, and are used for further illustrating preferred embodiments of the present invention and interpreting the principle and advantages of the present invention by examples.

FIG. 3 is a spectral graph of the multi-functional optical composite board in accordance with example 5 in the present invention, wherein FIG. 3 shows R.G.B peak values of the multi-functional optical composite board.

DETAILED DESCRIPTION

The present invention will be described in detail below in combination with exemplary embodiments and the accompanying drawings. All the examples are benefit for those skilled in the art to understand the present invention in further, but not limited hereto in any form. It should be noted that, those skilled in the art may make various modifications, variations and developments to the embodiments without departing from the spirit and concept of the claimed subject matter in the present invention. Thus, it is intended that those modifications or developments shall be covered in the protection scope of the present invention.

Figure 1:
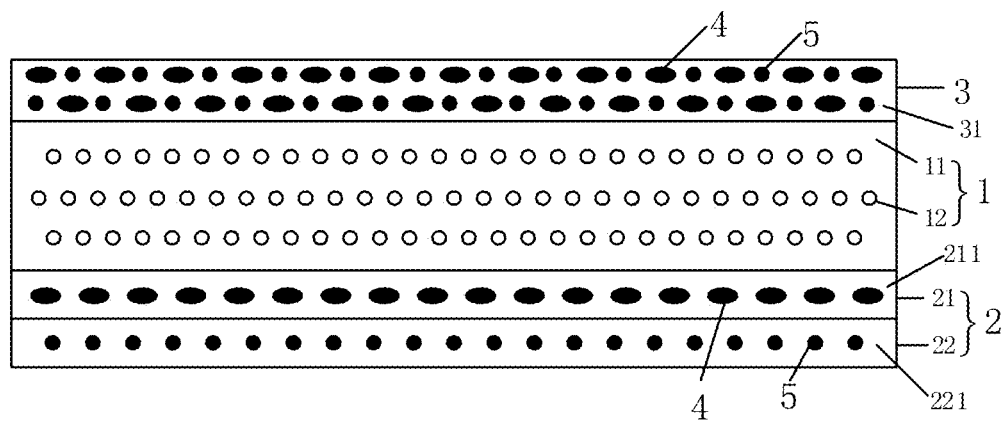
FIG. 1 is a structural diagram of a multi-functional optical composite board having quantum dots of high uniformity in accordance with the present invention.

As shown in FIG. 1, it provides a multi-functional optical composite board having quantum dots of high uniformity, which comprising a diffusion base layer 1, a first quantum dot-containing layer 2 disposed on the lower surface of the diffusion base layer 1, and a second quantum dot-containing layer 3 disposed on the upper surface of the diffusion base layer 1, wherein:

the diffusion base layer 1 comprises Genderal Polystyrene (GPPS) basal body 11, and functional additive particles 12 uniformly distributed and blended in the GPPS basal body;

the first quantum dot-containing layer 2 comprises a red quantum dot-containing layer 21 and a green quantum dot-containing layer 22, wherein the red quantum dot-containing layer comprises a first viscose substrate 211, and red quantum dot particles 4 uniformly distributed and blended in the first viscose substrate 211; the green quantum dot-containing layer 22 comprises a second viscose substrate 221, and green quantum dot particles 5 uniformly distributed and blended in the second viscose substrate 221; the red quantum dot-containing layer 21 is uniformly coated on the lower surface of the diffusion layer 1 by a coating process; the green quantum dot-containing layer 22 is uniformly coated on the lower surface of the red quantum dot-containing layer 21 by a coating process;

the second quantum dot-containing layer 3 comprises a third viscose substrate 31 and a plurality of different quantum-dot particles uniformly distributed and blended in the third viscose substrate 31. The different quantum-dot particles may be a mixture consisting of red quantum dot particles 4 and green quantum dot particles 5. The second quantum dot-containing layer 3 is deposited on the upper surface of the diffusion base layer 1 by coating repeatedly.

In further, the GPPS basal body 11 consists of GPPS as a main material, and the functional additive particles 12 are a mixture of two or three or more compositions selected from a light diffusing agent, a grinding agent, a dispersant, an antioxidant, a lubricant, a filling agent, a heat-resistant additive and/or a rigid additive; wherein, in the diffusion layer 1, the GPPS as a main material has a mass percentage of from 75% to 85% and the additive particles 12 has a mass percentage of from 15% to 25%.

In further, the diffusion base layer 1 is prepared by an extrusion molding process comprising: blending the GPPS basal body 11 and the additive particles 12 in accordance with a preset mass percentages thereof, to obtain an uniform mixture feed; and extrusion molding the uniform mixture feed.

In further, the red quantum dot particles 4 are fluorescent nanoparticles made of a semiconductor material, the red quantum dot particles 4 have an average size of from 2 nm to 6 nm, and the red quantum dot particles 4 are selected from CdSe, $CuInS_2$, $CuInSe_2$ or any combinations thereof.

In further, the green quantum dot particles 5 are fluorescent nanoparticles made of a semiconductor material, the green quantum dot particles 5 have an average size of from 2 nm to 6 nm, and the green quantum dot particles 5 are selected from CdSe, $CuInS_2$, $CuInSe_2$ or any combinations thereof.

In further, the red quantum dot particles 4 and the green quantum dot particles 5 are in a regular shape selected from spherical shape, dish and the like.

In further, the first viscose substrate 211 is a mixture of one or several selected from ingredient 1 of a first glue, ingredient of a second glue, varnish and n-butyl acetate at a mass ratio of 44.5:2.94:50:15.2. The first viscose substrate 211 is prepared, for example, by the following steps: blending ingredient 1 of the first glue, ingredient of the second glue, varnish and n-butyl acetate at a mass ratio of 44.5:2.94:50:15.2; and coagulating and shaping the first viscose substrate 211 by a heating cure or UV light cure. The second viscose substrate 221 is a mixture of one or several selected from ingredient 2 of a first glue, ingredient of a second glue, varnish and n-butyl acetate at a mass ratio of 46.2:5.35:50:15.2. The second viscose substrate 221 is prepared, for example, by the following steps: blending ingredient 2 of the first glue, ingredient of the second glue, varnish and n-butyl acetate at a mass ratio of 46.2:5.35:50:15.2; and coagulating and shaping the second viscose substrate by a heating cure or UV light cure. The third viscose substrate 31 is a mixture of one or several selected from ingredient 1 of a first glue, ingredient 2 of a first glue, ingredient of a second glue, varnish and n-butyl acetate at a mass ratio of 44.5:46.2:8.29:100:30.4. The third viscose substrate 31 is prepared, for example, by the following steps: blending ingredient 1 of the first glue, ingredient 2 of the first glue, ingredient of the second glue, varnish and n-butyl acetate at a mass ratio of 44.5:46.2:8.29:100:30.4; and coagulating and shaping the third viscose substrate 31 by a heating cure or UV light cure.

In further, the diffusion base layer 1 has a thickness of from 0.5 to 1.5 mm, the first quantum dot-containing layer 2 has a thickness of from 0.3 to 0.5 mm, and the second quantum dot-containing layer 3 has a thickness of from 0.1 to 0.3 mm.

In order to easily understand the technical solution of the present invention, the functional additive particles 12 mentioned in the above may the following ingredients: organic light diffusion agents such as PMMA, KMP-590, X-52-7056A and the like can be used as the light diffusion agent mainly for light refraction and reflection; grinding agent, having a high luminous flux can be used as the grinding agent mainly for light refraction and reflection and brightness enhancement; a dispersant, for example Dispersant 5040, is used as the dispersant for light uniform diffusion; a heat-resistant antioxidant such as silicone and an ultra violet (UV) light-resistant antioxidant such as a type of 1010 (pentaerythritol tetrakis (3-(3,5-di-Tert-Butyl-4-Hydroxyphenyl) propionate) is used as the antioxidants; an EBS wax such as N,N-ethylene bis-stearamide is used as the lubricant for dispersing and lubricating materials; zinc oxide is used as the filling agent mainly for increasing the haze of products; one or two of RHA-ZR (zirconium hydrogen phosphate), additive 299 (plastolyn 290) and any combinations thereof are used as the heat-resistant additive for increasing the heat-resistant performance of the product; and a type of MF001 by Mitsubishi Rayon Group is used as the rigid additive for increasing the stiffness and rigidness of the product.

Example 1

In example 1, a multi-functional optical composite board having quantum dots of high uniformity provided herein comprises a diffusion base layer 1, a first quantum dot-containing layer 2 disposed on the lower surface of the diffusion base layer 1, and a second quantum dot-containing layer 3 disposed on the upper surface of the diffusion base layer 1, wherein:

the diffusion base layer 1 comprises, a mass percentage of 75% Genderal Polystyrene (GPPS) basal body 11, and a mass percentage of 25% functional additive particles 12 uniformly distributed and blended in the GPPS basal body; and the diffusion layer 1 is prepared by uniformly blending the GPPS basal body 11 and the additive particles 12 in accordance with the above mass ratios and molding the mixture with a extrusion molding process to be a layer having a thickness of 0.5 mm;

the first quantum dot-containing layer 2 comprises a red quantum dot-containing layer 21 and a green quantum dot-containing layer 22, wherein the red quantum dot-containing layer 21 comprises a first viscose substrate 211, and red quantum dot particles 4 uniformly distributed and blended in the first viscose substrate 211; the green quantum dot-containing layer 22 comprises a second viscose substrate 221, and green quantum dot particles 5 uniformly distributed and blended in the second viscose substrate 221; the red quantum dot-containing layer 21 is uniformly coated on the lower surface of the diffusion layer 1 by a coating process; the green quantum dot-containing layer 22 is uniformly coated on the lower surface of the red quantum dot-containing layer 21 by a coating process; and the green quantum dot-containing layer has a thickness of 0.5 mm;

the second quantum dot-containing layer 3 comprises a third viscose substrate 31 and a plurality of different quantum-dot particles uniformly distributed and blended in the third viscose substrate 31, the different quantum-dot particles may be a mixture consisting of red quantum dot particles 4 and green quantum dot particles 5, the second quantum dot-containing layer 3 is deposited on the upper surface of the diffusion base layer 1 by coating repeatedly; and the green quantum dot-containing layer 3 has a thickness of 0.5 mm.

In this example, the GPPS basal body 11 consists of GPPS as a main material, and the functional additive particles 12 are a mixture of a light diffusing agent, a grinding agent, a dispersant, an antioxidant, a lubricant, a filling agent, a heat-resistant additive and/or a rigid additive; wherein the first viscose substrate 211 consists of a glue, the second viscose substrate 221 consists of a varnish, the third viscose substrate 31 is formed by blending a glue and varnish.

Example 2

In example 2, a multi-functional optical composite board having quantum dots of high uniformity provided herein comprises a diffusion base layer 1, a first quantum dot-containing layer 2 disposed on the lower surface of the diffusion base layer 1, and a second quantum dot-containing layer 3 disposed on the upper surface of the diffusion base layer 1, wherein:

the diffusion base layer 1 comprises a mass percentage of 80% Generral Polystyrene (GPPS) basal body 11, and a mass percentage of 20% additive particles 12 uniformly distributed and blended in the GPPS basal body; and the diffusion layer 1 is prepared by uniformly blending the GPPS basal body 11 and the additive particles 12 in accordance with the above mass ratios and molding the mixture with a extrusion molding process to be a layer having a thickness of 1.0 mm;

the first quantum dot-containing layer 2 comprises a red quantum dot-containing layer 21 and a green quantum dot-containing layer 22, wherein the red quantum dot-containing layer 21 comprises a first viscose substrate 211, and red quantum dot particles 4 uniformly distributed and blended in the first viscose substrate 211; the green quantum dot-containing layer 22 comprises a second viscose substrate 221, and green quantum dot particles 5 uniformly distributed and blended in the second viscose substrate 221; the red quantum dot-containing layer 21 is uniformly coated on the lower surface of the diffusion layer 1 by a coating process; the green quantum dot-containing layer 22 is uniformly coated on the lower surface of the red quantum dot-containing layer 21 by a coating process; and the first quantum dot-containing layer has a thickness of 0.3 mm;

the second quantum dot-containing layer 3 comprises a third viscose substrate 31 and a plurality of different quantum-dot particles uniformly distributed and blended in the third viscose substrate 31, the different quantum-dot particles may be a mixture consisting of red quantum dot particles 4 and green quantum dot particles 5, the second quantum dot-containing layer 3 is deposited on the upper surface of the diffusion base layer 1 by coating repeatedly; and the second quantum dot-containing layer 3 has a thickness of 0.1 mm.

In this example, the GPPS basal body 11 consists of GPPS as a main material, and the functional additive particles 12 are a mixture of a light diffusing agent, a grinding agent, a dispersant, an antioxidant, a lubricant, a filling agent, a heat-resistant additive and/or a rigid additive; wherein the first viscose substrate 211 consists of a glue, the second viscose substrate 221 consists of a varnish, the third viscose substrate 31 is formed by blending a glue and varnish.

Example 3

In example 3, a multi-functional optical composite board having quantum dots of high uniformity provided herein comprises a diffusion base layer 1, a first quantum dot-containing layer 2 disposed on the lower surface of the diffusion base layer 1, and a second quantum dot-containing layer 3 disposed on the upper surface of the diffusion base layer 1, wherein:

the diffusion base layer 1 comprises a mass percentage of 85% Generral Polystyrene (GPPS) basal body 11, and a mass percentage of 15% additive particles 12 uniformly distributed and blended in the GPPS basal body; and the diffusion layer 1 is prepared by uniformly blending the GPPS basal body 11 and the additive particles 12 in accordance with the above mass ratios and molding the mixture with a extrusion molding process to be a layer having a thickness of 1.5 mm;

the first quantum dot-containing layer 2 comprises a red quantum dot-containing layer 21 and a green quantum dot-containing layer 22, wherein the red quantum dot-containing layer 21 comprises a first viscose substrate 211, and red quantum dot particles 4 uniformly distributed and blended in the first viscose substrate 211; the green quantum dot-containing layer 22 comprises a second viscose substrate 221, and green quantum dot particles 5 uniformly distributed and blended in the second viscose substrate 221; the red quantum dot-containing layer 21 is uniformly coated on the lower surface of the diffusion layer 1 by a coating process; the green quantum dot-containing layer 22 is uniformly coated on the lower surface of the red quantum dot-containing layer 21 by a coating process; and the first quantum dot-containing layer has a thickness of 0.3 mm;

the second quantum dot-containing layer 3 comprises a third viscose substrate 31 and a plurality of different quantum-dot particles uniformly distributed and blended in the third viscose substrate 31, the different quantum-dot particles may be a mixture consisting of red quantum dot particles 4 and green quantum dot particles 5, the second quantum dot-containing layer 3 is deposited on the upper surface of the diffusion base layer 1 by coating repeatedly; and the second quantum dot-containing layer 3 has a thickness of 0.2 mm.

In this example, the GPPS basal body consists of GPPS as a main material, and the functional additive particles 12 are a mixture of a light diffusing agent, a grinding agent, a dispersant, an antioxidant, a lubricant, a filling agent, a heat-resistant additive and/or a rigid additive; wherein the first viscose substrate 211 consists of a glue, the second viscose substrate 221 consists of a varnish, the third viscose substrate 31 is formed by blending a glue and varnish.

Example 4

In example 4, a multi-functional optical composite board having quantum dots of high uniformity provided herein comprises a diffusion base layer 1, a first quantum dot-containing layer 2 disposed on the lower surface of the diffusion base layer 1, and a second quantum dot-containing layer 3 disposed on the upper surface of the diffusion base layer 1, wherein:

the diffusion base layer 1 comprises a mass percentage of 75% GPPS basal body 11, and a mass percentage of 25% functional additive particles 12 uniformly distributed and blended in the GPPS basal body; and the diffusion layer 1 is prepared by uniformly blending the GPPS basal body 11 and the additive particles 12 in accordance with the mass ratios and molding the mixture with a extrusion molding process to be a layer having a thickness of 1.5 mm;

the first quantum dot-containing layer 2 comprises a red quantum dot-containing layer 21 and a green quantum dot-containing layer 22, wherein the red quantum dot-containing layer 21 comprises a first viscose substrate 211, and red quantum dot particles 4 uniformly distributed and blended in the first viscose substrate 211; the green quantum dot-containing layer 22 comprises a second viscose substrate 221, and green quantum dot particles 5 uniformly distributed and blended in the second viscose substrate 221; the red quantum dot-containing layer 21 is uniformly coated on the lower surface of the diffusion layer 1 by a coating process; the green quantum dot-containing layer 22 is uniformly coated on the lower surface of the red quantum dot-containing layer 21 by a coating process; and the first quantum dot-containing layer has a thickness of 0.5 mm;

the second quantum dot-containing layer 3 comprises a third viscose substrate 31 and a plurality of different quantum-dot particles uniformly distributed and blended in the third viscose substrate 31, the different quantum-dot particles may be a mixture consisting of red quantum dot particles 4 and green quantum dot particles 5, the second quantum dot-containing layer 3 is deposited on the upper surface of the diffusion base layer 1 by coating repeatedly; and the second quantum dot-containing layer 3 has a thickness of 0.3 mm.

In this example, the GPPS basal body 11 consists of GPPS as a main material, and the functional additive particles 12 are a mixture of a light diffusing agent, a grinding agent, a dispersant, an antioxidant, a lubricant, a filling agent, a heat-resistant additive and/or a rigid additive; wherein the first viscose substrate 211 consists of a glue, the second viscose substrate 221 consists of a varnish, the third viscose substrate 31 is formed by blending a glue and varnish.

Example 5

In example 5, a multi-functional optical composite board having quantum dots of high uniformity provided herein comprises a diffusion base layer 1, a first quantum dot-containing layer 2 disposed on the lower surface of the diffusion base layer 1, and a second quantum dot-containing layer 3 disposed on the upper surface of the diffusion base layer 1, wherein:

the diffusion base layer 1 comprises, a mass percentage of 80% GPPS basal body 11, and a mass percentage of 20% additive particles 12 uniformly distributed and blended in the GPPS basal body; and the diffusion layer 1 is prepared by uniformly blending the GPPS basal body 11 and the additive particles 12 in accordance with the mass ratios and molding the mixture with a extrusion molding process to be a layer having a thickness of 0.5 mm;

the first quantum dot-containing layer 2 comprises a red quantum dot-containing layer 21 and a green quantum dot-containing layer 22, wherein the red quantum dot-containing layer 21 comprises a first viscose substrate 211, and red quantum dot particles 4 uniformly distributed and blended in the first viscose substrate 211; the green quantum dot-containing layer 22 comprises a second viscose substrate 221, and green quantum dot particles 5 uniformly distributed and blended in the second viscose substrate 221; the red quantum dot-containing layer 21 is uniformly coated on the lower surface of the diffusion layer 1 by a coating process; the green quantum dot-containing layer 22 is uniformly coated on the lower surface of the red quantum dot-containing layer 21 by a coating process; and the first quantum dot-containing layer has a thickness of 0.5 mm;

the second quantum dot-containing layer 3 comprises a third viscose substrate 31 and a plurality of different quantum-dot particles uniformly distributed and blended in the third viscose substrate 31, the different quantum-dot particles may be a mixture consisting of red quantum dot particles 4 and green quantum dot particles 5, the second quantum dot-containing layer 3 is deposited on the upper surface of the diffusion base layer 1 by coating repeatedly; and the second quantum dot-containing layer 3 has a thickness of 0.3 mm.

In this example, the GPPS basal body 11 is consisted of GPPS as a main material, and the functional additive particles 12 are a mixture of a light diffusing agent, a grinding agent, a dispersant, an antioxidant, a lubricant, a filling agent, a heat-resistant additive and/or a rigid additive; wherein the first viscose substrate 211 is consisted of a glue, the second viscose substrate 221 is consisted of a varnish, the third viscose substrate 31 is formed by mixing a glue and varnish.

Example 6

In example 6, a multi-functional optical composite board having quantum dots of high uniformity provided herein comprises a diffusion base layer 1, a first quantum dot-containing layer 2 disposed on the lower surface of the diffusion base layer 1, and a second quantum dot-containing layer 3 disposed on the upper surface of the diffusion base layer 1, wherein:

the diffusion base layer 1 comprises a mass percentage of 85% GPPS basal body 11, and a mass percentage of 15% additive particles 12 uniformly distributed and blended in the GPPS basal body; and the diffusion layer 1 is prepared by uniformly blending the GPPS basal body 11 and the additive particles 12 in accordance with the mass ratios and molding the mixture with a extrusion molding process to be a layer having a thickness of 1.0 mm;

the first quantum dot-containing layer 2 comprises a red quantum dot-containing layer 21 and a green quantum dot-containing layer 22, wherein the red quantum dot-containing layer 21 comprises a first viscose substrate 211, and red quantum dot particles 4 uniformly distributed and blended in the first viscose substrate 211; the green quantum dot-containing layer 22 comprises a second viscose substrate 221, and green quantum dot particles 5 uniformly distributed and blended in the second viscose substrate 221; the red quantum dot-containing layer 21 is uniformly coated on the lower surface of the diffusion layer 1 by a coating process; the green quantum dot-containing layer 22 is uniformly coated on the lower surface of the red quantum dot-containing layer 21 by a coating process; and the first quantum dot-containing layer has a thickness of 0.3 mm;

the second quantum dot-containing layer 3 comprises a third viscose substrate 31 and a plurality of different quantum-dot particles uniformly distributed and blended in the third viscose substrate 31, the different quantum-dot particles may be a mixture consisting of red quantum dot particles 4 and green quantum dot particles 5, the second quantum dot-containing layer 3 is deposited on the upper surface of the diffusion base layer 1 by coating repeatedly; and the second quantum dot-containing layer 3 has a thickness of 0.3 mm.

In this example, the GPPS basal body 11 consists of GPPS as a main material, and functional the additive particles 12 are a mixture of a light diffusing agent, a grinding agent, a dispersant, an antioxidant, a lubricant, a filling agent, a heat-resistant additive and/or a rigid additive; wherein the first viscose substrate 211 consists of a glue, the second viscose substrate 221 consists of a varnish, the third viscose substrate 31 is formed by blending a glue and varnish.

Performance Measurement of the Multi-Functional Optical Composite Boards Provided in Examples 1-6

All the multi-functional optical composite boards provided by examples 1-6 in the present invention are measured in the color gamut, brightness and overall visual quality.

Figure 2:
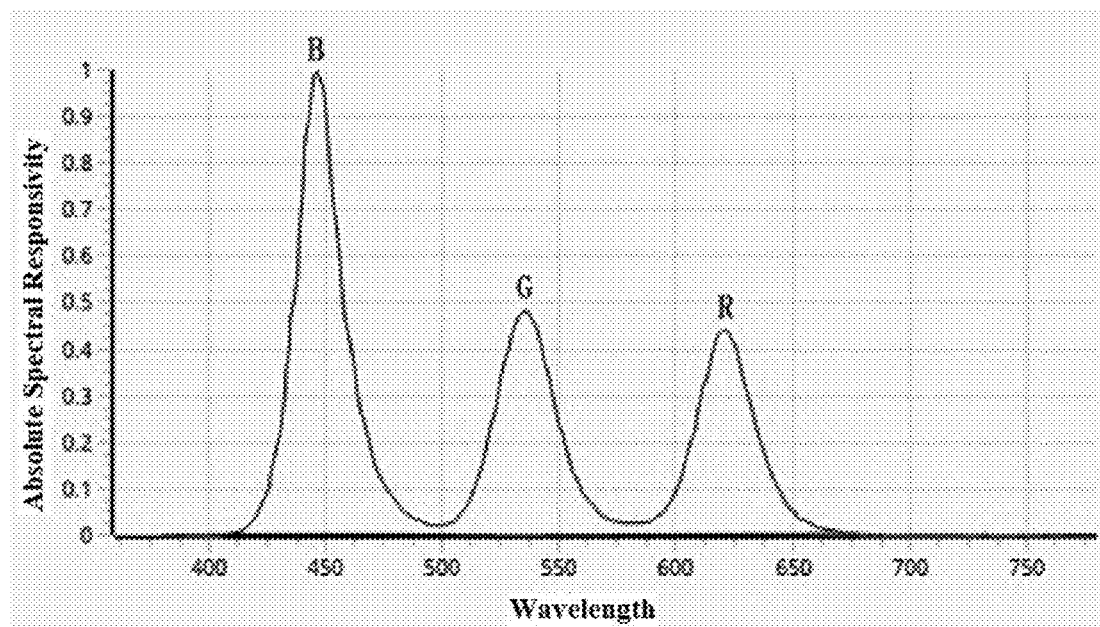
FIG. 2 is a spectral graph of a common diffusion panel matching with a quantum dot film, wherein it shows R.G.B peak values of the diffusion panel.

Herein, we also measure performance of a commercial common diffusion panel matching with a quantum dot film in the prior art, as a comparative example. The R.G.B peak values of the commercial common diffusion panel are shown in FIG. 2.

In comparison to the comparative example, all the multi-functional optical composite boards provided by examples 1-6 show better color gamut, better brightness and better visual quality.

Figure 3:
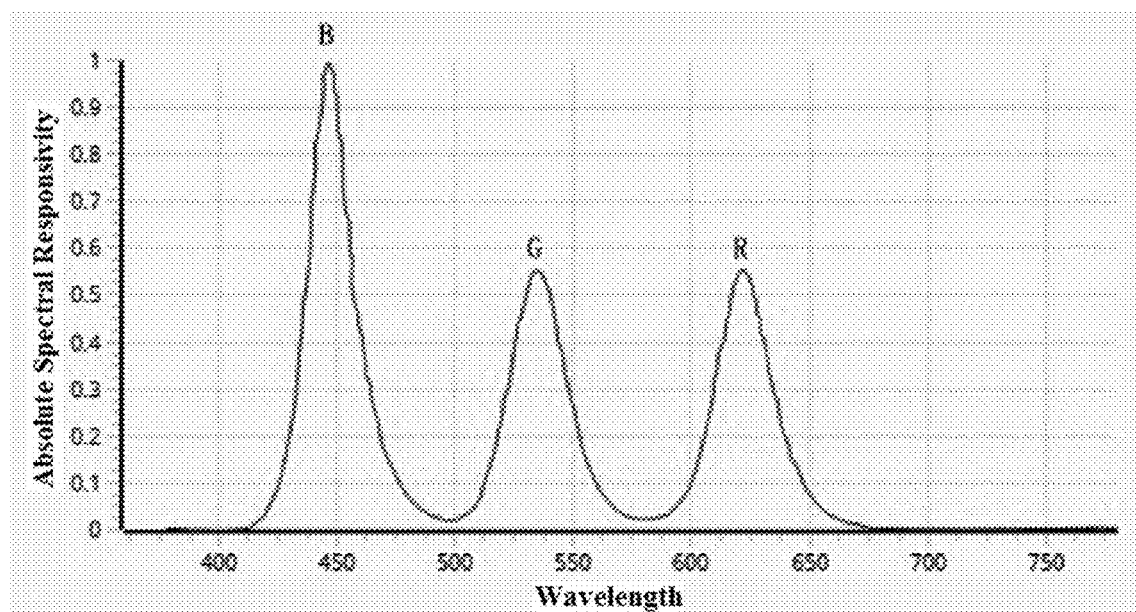

FIG. 3 shows a spectral graph of the multi-functional optical composite board in accordance with example 5 in the present application, wherein FIG. 3 shows R.G.B peak values of the multi-functional optical composite board.

In particular, the multi-functional optical composite boards in examples 1-6 are disposed and applied in a television set, then the composite boards in the television set are tested in color gamut. The test results are listed in table 1.

TABLE 1

Performance comparison among 6 examples and comparative example

| Items | W Values | X | Y | R Values | X | Y | G Values | X | Y | B Values | X | Y |
|---|---|---|---|---|---|---|---|---|---|---|---|---|
| Example 1 | 262 | 0.2751 | 0.2862 | 54.1 | 0.6743 | 0.3053 | 182 | 0.2223 | 0.7072 | 25.1 | 0.1542 | 0.0521 |
| Example 2 | 250 | 0.2635 | 0.2854 | 50 | 0.6742 | 0.3057 | 176 | 0.2209 | 0.7061 | 25.4 | 0.1541 | 0.0515 |
| Example 3 | 254 | 0.2689 | 0.2856 | 52.4 | 0.6742 | 0.3055 | 178 | 0.2206 | 0.706 | 25.4 | 0.1542 | 0.0516 |
| Example 4 | 256 | 0.2703 | 0.2859 | 53.8 | 0.6742 | 0.3058 | 180 | 0.2202 | 0.7059 | 25.3 | 0.1545 | 0.0519 |
| Example 5 | 259 | 0.2738 | 0.2868 | 55.2 | 0.6743 | 0.3057 | 183 | 0.2229 | 0.7065 | 25.3 | 0.1546 | 0.052 |
| Example 6 | 267 | 0.2764 | 0.2879 | 56 | 0.6744 | 0.3065 | 185 | 0.223 | 0.7086 | 25.2 | 0.1546 | 0.0523 |
| Comparative Example | 243 | 0.2619 | 0.2835 | 44.7 | 0.674 | 0.3035 | 173 | 0.2196 | 0.7058 | 25.5 | 0.1536 | 0.0548 |

It can be seen from the test result that, the multi-functional optical composite boards having quantum dots of high uniformity prepared by the technical solutions of the present application have shown excellent properties in aspects of color gamut, brightness, visual effect and the like. The products have a good stiffness, a better stability, an improved chrominance. The emitted light appears much whiter and brighter, and the product shows a better performance in usability.

All the examples described in the disclosure are preferred embodiments of the present invention. However, these embodiments of the present invention are not limited by the above-described examples, and any other changes, modifications, substitutions, combinations and simplifications, which do not depart from the spirit and principles of the present invention, are intended to be within the scope of the present invention.

The invention claimed is:

1. A multi-functional optical composite board having quantum dots of high uniformity, comprising a diffusion base layer, a first quantum dot-containing layer disposed on the lower surface of the diffusion base layer, and a second quantum dot-containing layer disposed on the upper surface of the diffusion base layer, wherein:

the diffusion base layer comprises Generral Polystyrene (GPPS) basal body, and functional additive particles uniformly distributed and blended in the GPPS basal body;

the first quantum dot-containing layer comprises a red quantum dot-containing layer and a green quantum dot-containing layer, wherein, the red quantum dot-containing layer comprises a first viscose substrate, and red quantum dot particles uniformly distributed and blended in the first viscose substrate;

the green quantum dot-containing layer comprises a second viscose substrate, and green quantum dot particles uniformly distributed and blended in the second viscose substrate;

the red quantum dot-containing layer is uniformly coated on the lower surface of the diffusion layer by a coating process; and the green quantum dot-containing layer is uniformly coated on the lower surface of the red quantum dot-containing layer by a coating process;

the second quantum dot-containing layer comprises a third viscose substrate and a plurality of different quantum-dot particles uniformly distributed and blended in the third viscose substrate, the different quantum-dot particles are a mixture consisting of red quantum dot particles and green quantum dot particles, the second quantum dot-containing layer is deposited on the upper surface of the diffusion base layer by coating repeatedly.

2. The multi-functional optical composite board having quantum dots of high uniformity according to claim 1, wherein:

the GPPS basal body consists of GPPS as a main material, and the functional additive particles are a mixture of two or three or more compositions selected from a light diffusing agent, a grinding agent, a dispersant, an antioxidant, a lubricant, a filling agent, a heat-resistant additive or a rigid additive;

wherein, the GPPS main material in the diffusion layer has a mass percentage of from 75% to 85%, and the functional additive particles has a mass percentage of from 15% to 25%.

3. The multi-functional optical composite board having quantum dots of high uniformity according to claim 2, wherein:

the diffusion base layer is prepared by an extrusion molding process comprising:

mixing the GPPS basal body and the functional additive particles in accordance with a preset mass percentage thereof, to obtain a uniform mixture feed; and extrusion molding the uniform mixture feed.

4. The multi-functional optical composite board having quantum dots of high uniformity according to claim 1, wherein:

the red quantum dot particles are fluorescent nanoparticles made of a semiconductor material, the red quantum dot particles have an average size of from 2 to 6 nm, and the red quantum dot particles are selected from CdSe, $CuInS_2$, $CuInSe_2$ or any combinations thereof.

5. The multi-functional optical composite board having quantum dots of high uniformity according to claim 1, wherein:

the green quantum dot particles are fluorescent nanoparticles made of a semiconductor material, the green quantum dot particles have an average size of from 2 to 6 nm, and the green quantum dot particles are selected from CdSe, $CuInS_2$, $CuInSe_2$ or any combinations thereof.

6. The multi-functional optical composite board having quantum dots of high uniformity according to claim 1, wherein:

the red quantum dot particles and the green quantum dot particles are in a regular shape selected from spherical shape, dish and the like.

7. The multi-functional optical composite board having quantum dots of high uniformity according to claim 1, wherein:

the first viscose substrate is a mixture of one or several selected from gradient 1 of a first glue, gradient of a second glue, vanish and n-Butyl acetate at a mass ratio of 44.5:2.94:50:15.2, and the first viscose substrate is coagulated and shaped by a heating cure or UV light cure;

the second viscose substrate is a mixture of one or several selected from gradient 2 of the first glue, gradient of the second glue, vanish and n-butyl acetate at a mass ratio of 46.2:5.35:50:15.2, and the second viscose substrate is coagulated and shaped by a heating cure or UV light cure;

the third viscose substrate is a mixture of one or several selected from gradient 1 of the first glue, gradient 2 of the first glue, gradient of the second glue, vanish and n-butyl acetate at a mass ratio of 44.5:46.2:8.29:100:30.4, and the third viscose substrate is coagulated and shaped by a heating cure or UV light cure.

8. The multi-functional optical composite board having quantum dots of high uniformity according to claim 4, wherein:

the first viscose substrate is a mixture of one or several selected from gradient 1 of a first glue, gradient of a second glue, vanish and n-Butyl acetate at a mass ratio of 44.5:2.94:50:15.2, and the first viscose substrate is coagulated and shaped by a heating cure or UV light cure;

the second viscose substrate is a mixture of one or several selected from gradient 2 of the first glue, gradient of the second glue, vanish and n-butyl acetate at a mass ratio of 46.2:5.35:50:15.2, and the second viscose substrate is coagulated and shaped by a heating cure or UV light cure;

the third viscose substrate is a mixture of one or several selected from gradient 1 of the first glue, gradient 2 of the first glue, gradient of the second glue, vanish and n-butyl acetate at a mass ratio of 44.5:46.2:8.29:100:30.4, and the third viscose substrate is coagulated and shaped by a heating cure or UV light cure.

9. The multi-functional optical composite board having quantum dots of high uniformity according to claim 5, wherein:

the first viscose substrate is a mixture of one or several selected from gradient 1 of a first glue, gradient of a second glue, vanish and n-Butyl acetate at a mass ratio of 44.5:2.94:50:15.2, and the first viscose substrate is coagulated and shaped by a heating cure or UV light cure;

the second viscose substrate is a mixture of one or several selected from gradient 2 of the first glue, gradient of the second glue, vanish and n-butyl acetate at a mass ratio of 46.2:5.35:50:15.2, and the second viscose substrate is coagulated and shaped by a heating cure or UV light cure;

the third viscose substrate is a mixture of one or several selected from gradient 1 of the first glue, gradient 2 of the first glue, gradient of the second glue, vanish and n-butyl acetate at a mass ratio of 44.5:46.2:8.29:100:30.4, and the third viscose substrate is coagulated and shaped by a heating cure or UV light cure.

10. The multi-functional optical composite board having quantum dots of high uniformity according to claim 6, wherein:

the first viscose substrate is a mixture of one or several selected from gradient 1 of a first glue, gradient of a second glue, vanish and n-Butyl acetate at a mass ratio of 44.5:2.94:50:15.2, and the first viscose substrate is coagulated and shaped by a heating cure or UV light cure;

the second viscose substrate is a mixture of one or several selected from gradient 2 of the first glue, gradient of the second glue, vanish and n-butyl acetate at a mass ratio of 46.2:5.35:50:15.2, and the second viscose substrate is coagulated and shaped by a heating cure or UV light cure;

the third viscose substrate is a mixture of one or several selected from gradient 1 of the first glue, gradient 2 of the first glue, gradient of the second glue, vanish and n-butyl acetate at a mass ratio of 44.5:46.2:8.29:100:30.4, and the third viscose substrate is coagulated and shaped by a heating cure or UV light cure.

11. The multi-functional optical composite board having quantum dots of high uniformity according to claim 1, wherein the diffusion base layer has a thickness of from 0.5 to 1.5 mm, the first quantum dot-containing layer has a thickness of from 0.3 to 0.5 mm, and the second quantum dot-containing layer has a thickness of from 0.1 to 0.3 mm.

* * * * *